(12) United States Patent
Sunaga (10) Patent No.: US 8,359,427 B2
(45) Date of Patent: Jan. 22, 2013

(54) SEMICONDUCTOR DEVICE

(75) Inventor: Daisuke Sunaga, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 357 days.

(21) Appl. No.: 12/789,968

(22) Filed: May 28, 2010

(65) Prior Publication Data

US 2010/0325350 A1 Dec. 23, 2010

(30) Foreign Application Priority Data

Jun. 17, 2009 (JP) ................................. 2009-144500

(51) Int. Cl.
*G06F 12/00* (2006.01)
(52) U.S. Cl. ...................................................... 711/104
(58) Field of Classification Search ........................ None
See application file for complete search history.

(56) References Cited

U.S. PATENT DOCUMENTS

| 7,610,436 | B2 | 10/2009 | Nakano | |
|---|---|---|---|---|
| 2005/0066112 | A1 | 3/2005 | Osakabe et al. | |
| 2011/0182116 | A1* | 7/2011 | Ogawa et al. | ............. 365/185.2 |

FOREIGN PATENT DOCUMENTS

| JP | 2005-92659 A | 4/2005 |
|---|---|---|
| JP | 2006-260468 A | 9/2006 |

* cited by examiner

*Primary Examiner* — Brian Peugh
(74) *Attorney, Agent, or Firm* — Foley & Lardner LLP

(57) ABSTRACT

In executing an EEPROM emulation by a flash memory incorporated in a semiconductor device, there is a problem that the data holding period of the flash memory is shorter than the EEPROM. The flash memory manages data by block unit. Therefore, it is required to securely perform a block change before the specification of the data holding period of the flash memory passes. For satisfying this problem, for an EEPROM substitution area in a flash memory, a data level check voltage is set between an internal verification voltage and a read-out voltage. When data level becomes below the data level check voltage, the block change is performed.

10 Claims, 13 Drawing Sheets

Fig. 1
PRIOR ART

10: DATA WRITING/READING DEVICE

SEMICONDUCTOR DEVICE

INCORPORATION BY REFERENCE

This Patent Application is based on Japanese Patent Application No. 2009-144500. The disclosure of the Japanese Patent Application is incorporated herein by reference.

BACKGROUND OF THE INVENTION

1. Field of the Invention

The present invention relates to a semiconductor device and an EEPROM emulation method using the semiconductor device, and in particular relates to a semiconductor device with a built-in flash memory and an EEPROM emulation method using the semiconductor device.

2. Description of Related Art

In order to rewrite and store data, the EEPROM (Electrically Erasable Programmable Read Only Memory) has been used as an externally attached device. For the same purpose, the flash memory is used more frequently today, which can be integrated in semiconductor devices such as microcomputers and can be handled easier than the EEPROM. To be more specific, a flash memory incorporated in a semiconductor device such as a microcomputer is used to emulate the EEPROM so as to rewrite and store data.

Figure 1:
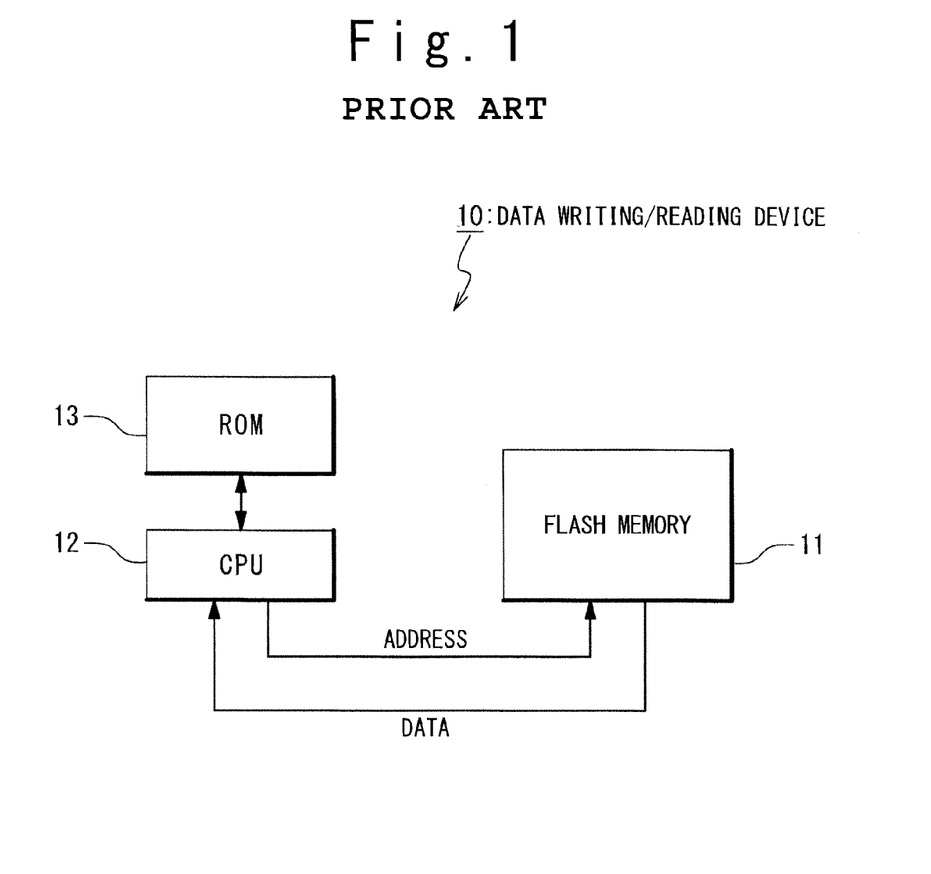
FIG. 1 is a block diagram to explain a configuration of a data writing/reading control device according to a conventional technique.

In relation to the above technique, for reference, the Patent Document 1 (Japanese Patent Application Publication JP-P2005-92659A) discloses a control device to write/read data. FIG. 1 is a block diagram to explain the configuration of a data writing/reading control device 10 according to the reference technique.

The data writing/reading control device 10 is provided with a flash memory 11, a CPU 12 and a ROM 13. The CPU 12 is connected to the flash memory 11 and the ROM 13 in the data writing/reading control device 10.

Here, the memory is divided into a plurality of blocks. When data is written in one of the plurality of the blocks, writing means is used to compare a free region capacity in the block and an amount of data to be written. If the amount of data to be written is larger, the writing means erases entire data written in the block, followed by writing data sequentially from the head or tail of the block. If the amount of data to be written is smaller, the writing means writes data sequentially from the region next to the region in which data is written in the block. When data is read from the block, the reading means is used to search for the region in which data is written lastly from the head or tail of the block sequentially so as to read data written in the region.

Figure 2:
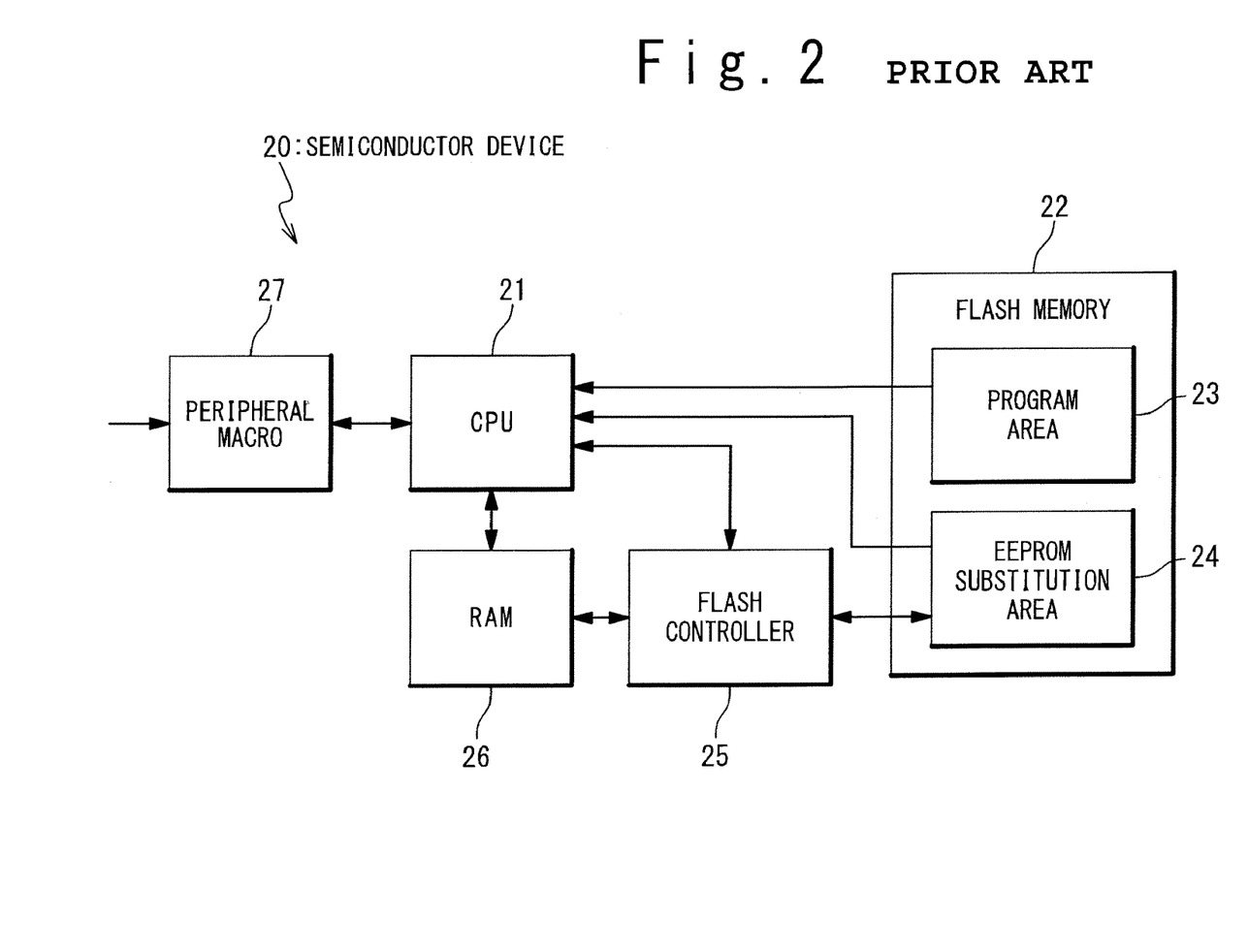
FIG. 2 is a block diagram to explain a configuration of a semiconductor device according to a conventional technique.

As a further reference technique, Patent Document 2 (Japanese Patent Application Publication JP-P2006-260468A) discloses a semiconductor device. FIG. 2 is a block diagram to explain the configuration of the semiconductor device 20 according to the reference technique.

The semiconductor device 20 is provided with a CPU 21, a flash memory 22, a flash controller 25, a RAM 26, and a peripheral macro 27. The flash memory 22 includes a program area 23 and an EEPROM substitution area 24.

The CPU 21 is connected to the program area 23 and the EEPROM substitution area 24 in the flash memory 22, the flash controller 25, the RAM 26 and the peripheral macro 27. The flash controller 25 is connected to the EEPROM substitution area 24 in the flash memory 22 and the RAM 26.

The program area 23 is used to store a flash operation program. The EEPROM substitution area 24 is used to store various kinds of data. From the program area 23, the CPU 21 reads the flash operation program which is executed to control the flash controller 25. The flash controller 25 updates data in the EEPROM substitution area 24 in accordance with a control performed by the CPU 21.

Figure 3:
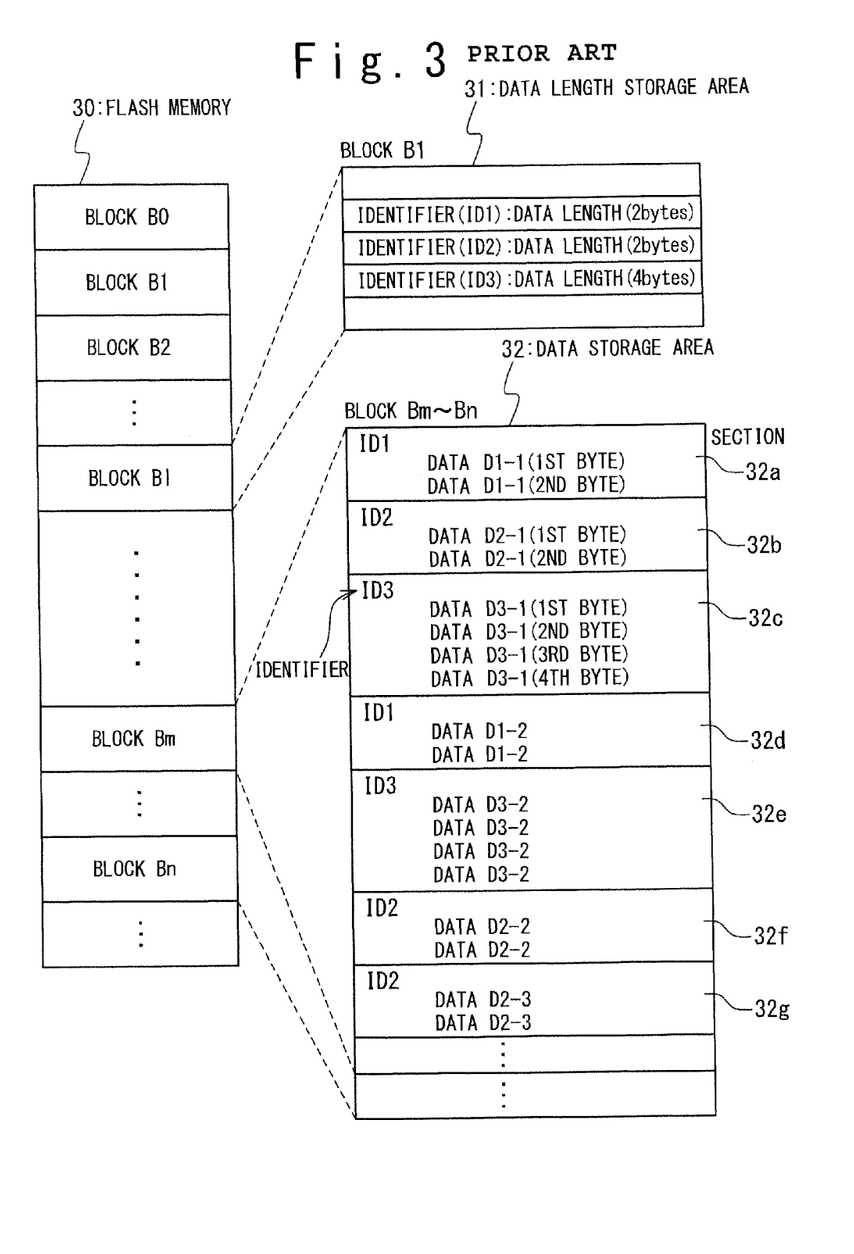
FIG. 3 is a schematic diagram to explain a further detailed configuration of a flash memory in FIG. 2.

FIG. 3 is a schematic diagram to explain a further detailed configuration of the flash memory 22 in FIG. 2.

A flash memory 30 includes a data length storage area 31 and a data storage region 32. The flash memory 30 in FIG. 3 corresponds to the flash memory 22 in FIG. 2.

The data storage region 32 includes a plurality of sections 32a to 32g. A part of the plurality of the sections 32a to 32g in FIG. 3 corresponds to the data length storage area 23 in FIG. 2 and the remaining parts thereof correspond to the data storage region 24 in FIG. 2.

The EEPROM substitution area 24 uses a part of the flash memory 30 as the data length storage area 31 and the data storage region 32. Data updating by an EEPROM emulation function is realized by additionally writing data while updating an address in the data storage region 32.

Next, explanation will be made for a case in which, for example, a block Bm included in the data storage region 32 is brought into a data full state due to additional writing. In this case, a block subjected to write data is changed to a next block which is a block Bm+1 in order to maintain data updating by EEPROM emulation.

A data holding period in the block Bm is applied to while whose starting point is at the timing of the writing in the section 32a which is an initial data writing in that block. Note that, also for a data holding period disclosed in the Patent Document 1, the timing at which data is written initially in a block subjected to write data is used as a starting point.

Figure 4A:
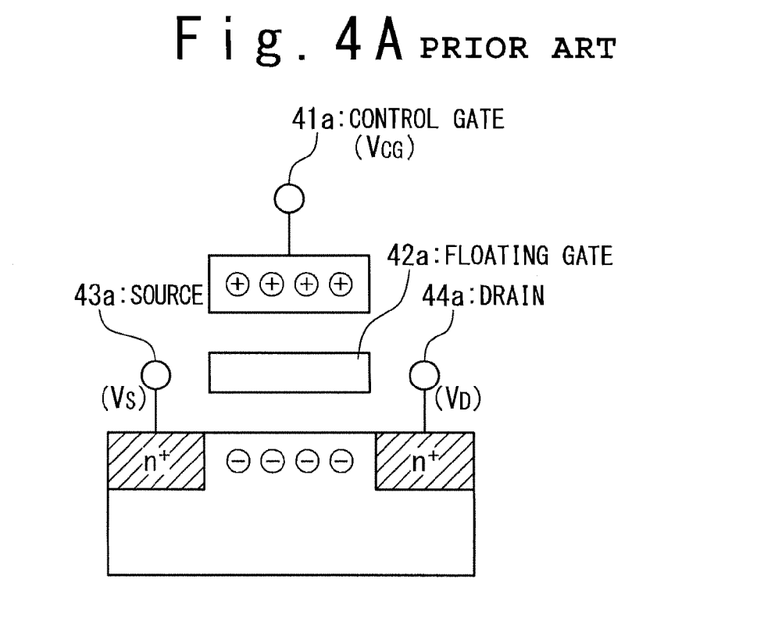
FIG. 4A is a cross-sectional view to explain an initial state of a MOS transistor used as a flash memory.
Figure 4B:
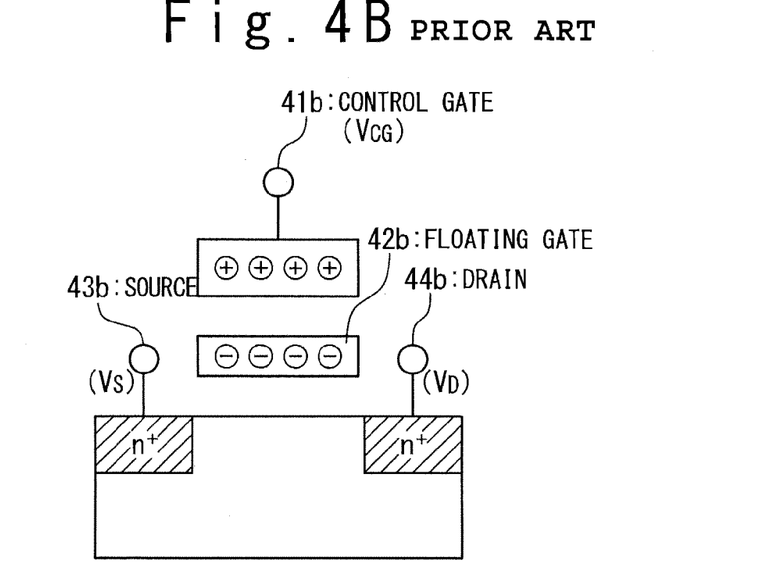
FIG. 4B is a cross-sectional view to explain a written state in the flash memory.

Next, the principle of the operation of the general flash memory is described. FIGS. 4A and 4B are cross-sectional views to explain a configuration of an MOS transistor which is used as a flash memory. FIG. 4A is a cross-sectional view to explain an initial state in the flash memory. FIG. 4B is a cross-sectional view to explain a written state in the flash memory.

The MOS transistor is provided with a control gate 41a or 41b, a floating gate 42a or 42b, a source 43a or 43b, and a drain 44a or 44b. In other words, the MOS transistor includes a two-layer polycrystalline silicon gate which is made of the floating gate 42a or 42b and the control gate 41a or 41b.

The MOS transistor in the initial state as shown in FIG. 4A does not have an electric charge in the floating gate. In contrast, the MOS transistor in the written state as shown in FIG. 4B has electrons in the floating gate.

Figure 5A:
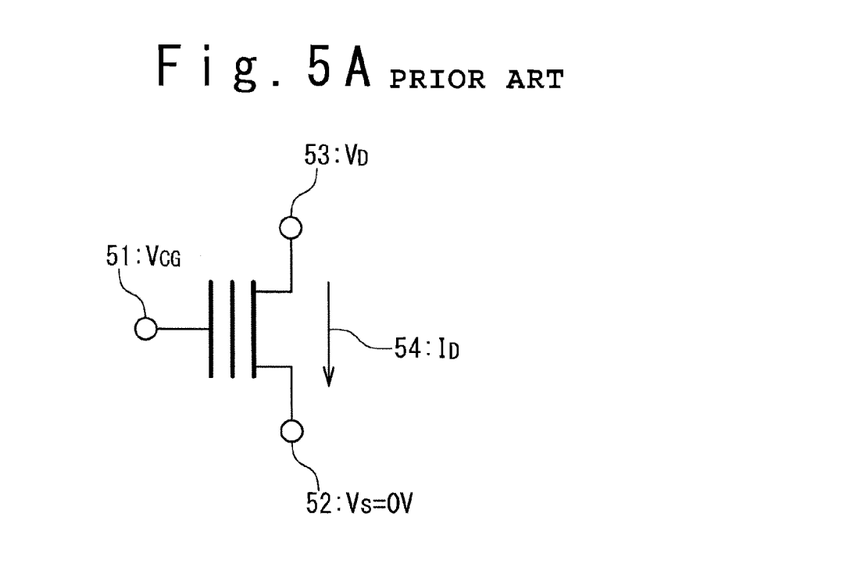
FIG. 5A is a schematic diagram of a MOS transistor used as a flash memory.
Figure 5B:
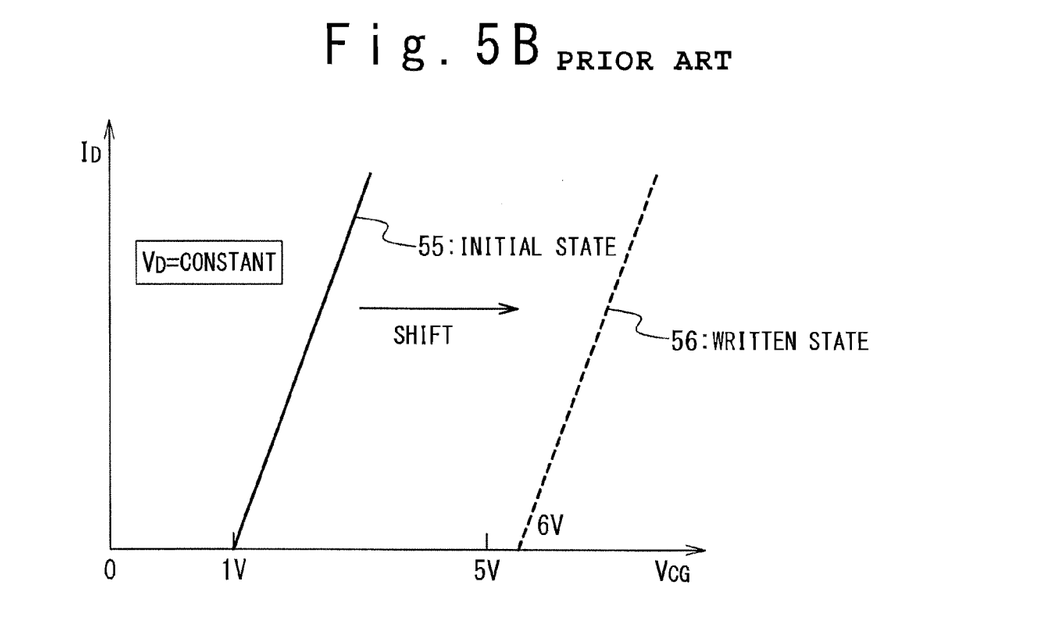
FIG. 5B is a graph to explain a change in the relationship between a voltage and a current under an initial state and a written state of the flash memory.

FIGS. 5A and 5B are diagrams to explain the relationship between a voltage applied to a control gate and a current flowing as a result thereof in the MOS transistor used as a flash memory. FIG. 5A is a schematic diagram of the MOS transistor used as a flash memory. FIG. 5B is a graph to explain a change in the relationship between the voltage and the current under the initial state and the written state.

As shown in FIG. 5A, if a voltage VCG is applied to a control gate 51 with a voltage VD being applied to a drain 53 and a voltage VS (=0V) being applied to a source 52, a current ID is made to flow from the drain 53 to the source 52. The drain voltage VD is assumed to be constant.

In the graph of FIG. 5B, the lateral axis indicates the voltage VCG applied to the control gate 51 and the vertical axis indicates the current ID. Here, the first graph 55 shows an initial state and the second graph 56 shows a written state. In this example, the current ID starts flowing when the voltage VCG applied to the control gate 51 exceeds 1V in the initial state 55 without electrons in a floating gate. In other words, a threshold voltage is 1V in the initial state.

Next, a case is explained in which the voltage VCG is applied to the control gate 51 in the written state 56 with electrons in the floating gate. In this case, the current ID is prevented from flowing due to electrons in the floating gate when the voltage VCG is low and finally starts flowing when the voltage VCG exceeds 6V.

Accordingly, the MOS transistor can be used as a semiconductor nonvolatile memory with 1 bit by determining the initial state 55 as "1" and the written state 56 as "0".

Next, operations to read, erase and write data in the semiconductor nonvolatile memory will be explained.

First of all, as explained above, as operation to read data, whether a bit is "0" or "1" can be read by determining whether or not the current ID is made to flow on a data line, namely, between the drain 53 and the source 52.

Next, as an operation to erase data, electrons can be extracted from the floating gate by applying a positive voltage to the source and the drain. That is, a bit can be turned into "1".

Lastly, as an operation to write data, an erased state is realized in advance as a prerequisite.

That is, immediately before an operation to write data, there is nothing to execute when "1" is written because a bit is already corresponding to "1". Only when "0" is written, a positive voltage is applied to the control gate 51 so as to inject electrons to the floating gate before reaching a threshold range in which a bit is determined to "0".

SUMMARY

EEPROM emulation is a technique which allows a flash memory incorporated in a semiconductor device such as microcomputer to substitute for functions of EEPROM. Accordingly, the flash memory needs to satisfy specifications of EEPROM by which data is rewritten and stored. However, a period to hold data in a flash memory is shorter comparing with the EEPROM whose data holding period is usually 10 years or more.

The data holding period here means a period in which read data is guaranteed to have the same value as write data while taking account of such characteristics that a write data level deteriorates gradually due to a factor such as age. The data holding period is an important specification item in terms of using a flesh memory as a memory to hold data. Note that the data holding period varies depending on devices. Years of the data holding period are expressed as "X years" hereinafter.

Figure 6:
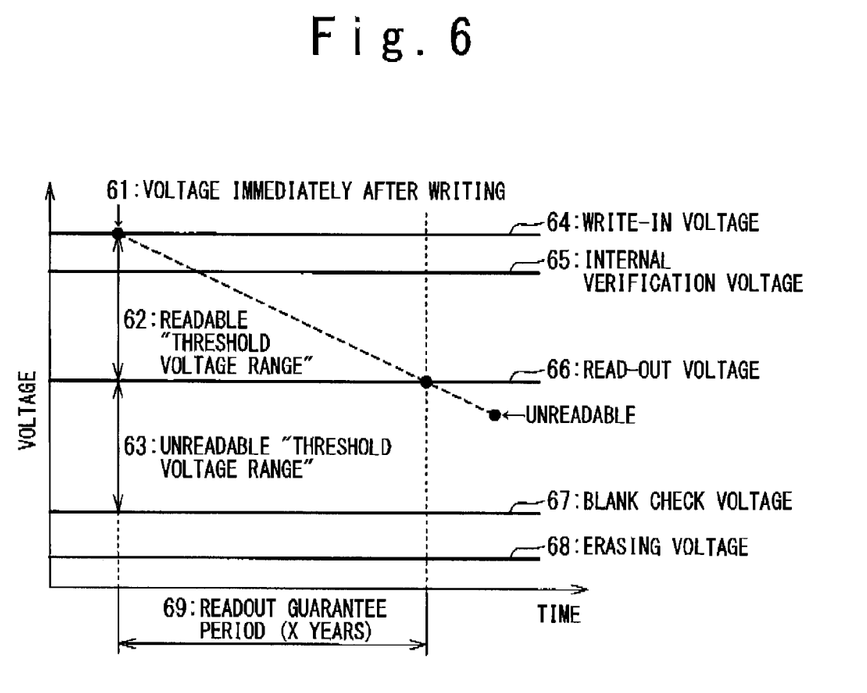
FIG. 6 is a graph to explain one example of a secular change in a write data level in the flash memory.

Next, deterioration of a write data level will be explained. FIG. 6 is a graph to explain one example of a secular change in a write data level of a flash memory. In this graph, the lateral axis indicates time and the vertical axis indicates a voltage in the floating gate of a flash memory.

A write-in voltage 64 indicates a voltage applied to a control gate for writing data in the flash memory. A voltage 61 immediately after writing indicates a floating gate voltage obtained immediately after writing data in the flash memory and equals to the write-in voltage 64. A read-out voltage 66 is a minimum value of the floating gate voltage which guarantees data written in the flash memory is readable. A readable threshold voltage range 62 equals to the range from the write-in voltage 64 to the read-out voltage 66. An internal verification voltage 65 is a voltage used when data written in the flash memory is read so as to confirm whether it is written correctly, and included in the readable threshold voltage range 62. An erasing voltage 68 indicates a voltage applied to a control gate when data written in the flash memory is erased. A blank check voltage 67 indicates a voltage applied to a control gate so as to confirm data written in the flash memory is erased. An unreadable threshold voltage range 63 equals to the range from the read-out voltage 66 to the blank check voltage 67.

When data is written in the flash memory, electrons injected to the floating gate move to a direction of a lower energy level along with the elapse of time. As a result, the voltage in the floating gate, namely, a data level decreases along with an elapse of time as shown in the graph of FIG. 6. If the data level decreases to be lower than the read-out voltage 66, data written in the flash memory loses its validity even if it is read successfully.

The X years regarded as a data holding period in the flash memory are applied to each block by using initial data written in a used block as a starting point. Accordingly, a starting point of the data holding period is refreshed by changing the block to write data before passing through X years. That is, it is possible to practically secure the data holding period more than the X year.

However, if a block is not changed to other block before passing through the X year, the specification to hold data passes. As a result, the problem occurs that the validity of data written in the flash memory is lost.

More details of this problem will be explained. EEPROM emulation is realized by such a method that a new data is additionally written by changing an address using a plurality of blocks included in the flash memory. Accordingly, in general, it is sufficient to change a block to write data at timing at which a used data block is brought into a data full state.

However, a period from initial writing to reach a data full state depends on the length of data to be written and the frequency of writing data. The length of data to be written is determined depending on the system on which the EEPROM emulation function is mounted. In contrast, the frequency of writing data cannot be determined uniquely in a design stage because it depends on usage environment of a terminal user of the system.

Owing to the above reasons, it is impossible in reference techniques to securely execute a block change prior to exceeding a data holding period in specifications.

According to an aspect of the present invention, a semiconductor device includes a flash memory, a CPU and a data level check circuit. The flash memory has an EEPROM substitution area for performing an EEPROM emulation. The data level check circuit is provided for performing a comparison between a voltage level corresponding to a data written in any of blocks of the EEPROM substitution area and a predetermined data level check voltage. The CPU performs a block change by which the data is read out from said any of blocks and written in another block when the voltage level corresponding to the data becomes lower than the data level check voltage.

According to another aspect of the present invention, an emulation method of an EEPROM includes; performing a comparison between a voltage level corresponding to a data written in any of blocks of an EEPROM substitution area and a predetermined data level check voltage; and performing a block change by which the data is read out from said any of blocks and written in other block when the voltage level corresponding to the data becomes lower than the data level check voltage.

In a semiconductor device according to some embodiments of the present invention, a data level check voltage is set additionally between an internal verification voltage and a read-out voltage in an EEPROM substitution area of a flash memory. A data level check I/F is also added in an EEPROM emulation method according to an embodiment of the present invention so as to compare a data level and a data level check voltage. In an embodiment of the present invention, if a data level falls under a data level check voltage, a block change is executed on data which is desirably secured to read in an EEPROM substitution area of a flash memory.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

In the following, some exemplary embodiments of a semiconductor device and an EEPROM emulation method according to the present invention will be explained.

(First Embodiment)

Figure 7:
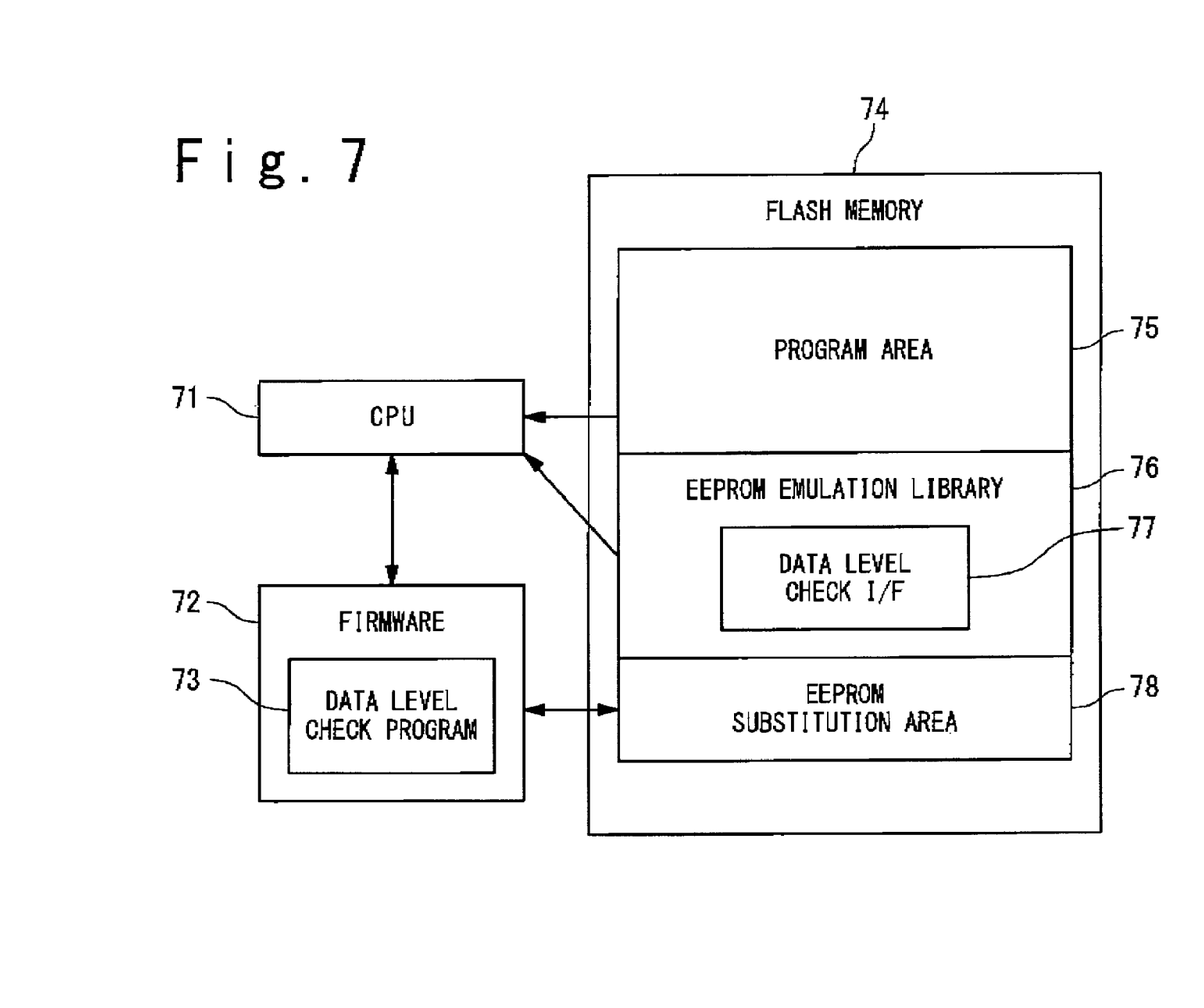
FIG. 7 is a block diagram to explain a configuration of a semiconductor device according to a first embodiment of the present invention.

FIG. 7 is a block diagram to explain a configuration of a semiconductor device according to a first embodiment of the present invention. The semiconductor device is provided with a CPU 71, a firmware part 72 and a flash memory part 74. The firmware part 72 includes a data level check program part 73. The flash memory part 74 includes a program area 75, an EEPROM emulation library 76 and an EEPROM substitution area 78. The EEPROM emulation library 76 includes a data level check I/F (InterFace) 77.

The CPU 71 is connected to the firmware part 72, the program area 75 and the EEPROM emulation library 76. The firmware part 72 is further connected to the EEPROM substitution area 78.

Operation in the semiconductor device or an EEPROM emulation method according to the present invention will be explained below. Initially, the CPU 71 reads required programs from the EEPROM emulation library in the flash memory part 74 and executes them. Next, as a result thereof, the CPU 71 reads various kinds of programs stored in the firmware part 72 and executes various operations corresponding to the read programs with respect to the EEPROM substitution area. The various operations with respect to the EEPROM substitution area include operations such as writing data, reading data, verifying a write level, erasing data and checking a data level.

Explained here will be a data level check according to the present embodiment. Note that operations to write data, read data, verify a write level and erase data with respect to the semiconductor device according to the present embodiment are the same as those of conventional techniques and detailed explanation thereof will be omitted.

A voltage level corresponding to data written in the flash memory is eventually turned into an unreadable state due to deterioration with age. Data level check is executed to examine a state of deterioration of a voltage level.

After data is written in the EEPROM substitution area 78, the CPU 71 reads the data level check I/F 77 from the EEPROM emulation library 76 at any timing so as to execute. As a result, the CPU 71 reads the data level check program 73 from the firmware 72 so as to execute.

When the data level check program 73 is executed, a data level check circuit included in the flash memory executes a data level check. Similar to a write level verifying circuit according to conventional techniques, the data level check circuit compares a data level voltage of any selected MOS transistor in the flash memory and a predetermined threshold voltage. Details of the threshold voltage will be explained later.

The timing to execute data level check may be any timing as long as the semiconductor device according to the present invention is being activated and may be in particular set by a user's intention.

Figure 8:
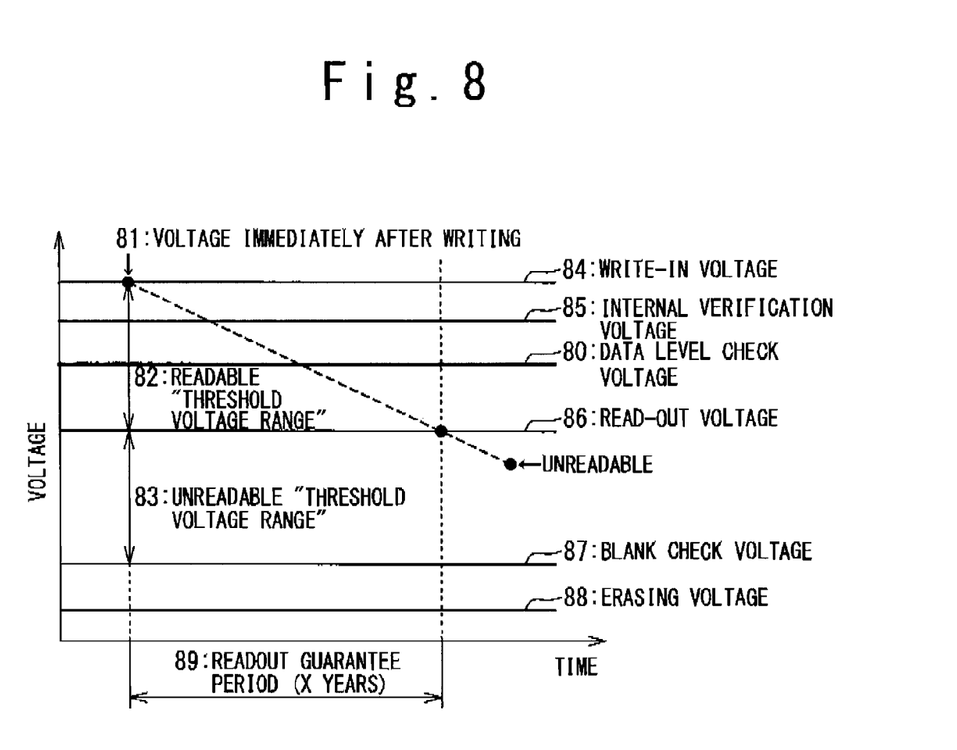
FIG. 8 is a graph to explain one example of a secular change in a write data level in a flash memory.

FIG. 8 is a graph to explain one example of a secular change in a write data level in the flash memory. In this graph, the lateral axis indicates time and the vertical axis indicates a voltage in a floating gate of the flash memory.

A write-in voltage 84 indicates a voltage applied to a control gate when data is written in the flash memory. A voltage 81 immediately after writing indicates a floating gate voltage detected immediately after data is written in the flash memory and equals to the write-in voltage 84. A read-out voltage 86 is a minimum value of the floating gate voltage for guaranteeing data written in the flash memory is readable. A readable threshold voltage range 82 equals to the range from the write-in voltage 84 to the read-out voltage 86. An internal verification voltage 85 is a voltage used when data written in the flash memory is read so as to confirm whether it is written correctly and included in the readable threshold voltage range 82. A data level check voltage 80 corresponds to a voltage level which is used as a reference to determine necessity of a block change for data written in the flash memory, and a value thereof is set in a range between the internal verification voltage 85 and the read-out voltage 86. An erasing voltage 88 indicates a voltage applied to the control gate when data written in the flash memory is erased. A blank check voltage 87 indicates a voltage applied to the control gate so as to confirm data written in the flash memory is erased. An unreadable threshold voltage range 83 equals to a range from the read-out voltage 86 to the blank check voltage 87.

When data is written in the flash memory, electrons injected in the floating gate will move to a direction of a lower energy level along with an elapse of time. As a result, the voltage of the floating gate or a data level decreases along with the elapse of time as shown in the graph in FIG. 8. If the data level decreases to be lower than the read-out voltage 86, data written in the flash memory loses its validity even if it is read successfully.

The aforementioned write level verifying circuit according to the reference technique is activated immediately after data is written in a flash memory. The write level verifying circuit compares a data level in a floating gate of a MOS transistor in which data is written and the internal verification voltage 85. If the data level is equal to or more than the internal verification voltage 85, it is determined that data is written successfully. On the contrary, if the data level is less than the internal verification voltage 85, it is determined that data is written unsuccessfully, wherein data writing needs to be retried and/or a decision needs to be made to use other MOS transistor by determining the MOS transistor is unusable.

Similarly, the aforementioned data level check circuit according to the present embodiment compares the data level in a floating gate of an MOS transistor in which data is stored and the data level check voltage 80.

Note that the data level check circuit according to the present embodiment may also be a circuit which is independent from the write level verifying circuit and may also be integrated into the write level verifying circuit.

In the former case, two write level verifying circuits according to the conventional technique are prepared. For one of them, the internal verification voltage 85 same to that of the conventional technique is used. For another one of them, the data level check voltage 80 is used as the threshold voltage. The write level verifying circuit and the data level check circuit, which are independent from each other, can be thus realized.

In the latter case, the write level verifying circuit according to the conventional technique is improved so that either the internal verification voltage 85 or the data level check voltage 80 can be selected as the threshold voltage. An integrated circuit including the write level verifying circuit and the data level check circuit can be thus realized.

According to the present embodiment, when a data level is confirmed to have fallen under the data level check voltage 80, it is determined that deterioration of a data level advanced and a block change is determined for corresponding data. Note that it is desirable that all bits which are present in a storage region and need to be guaranteed to have validity are subjected to a data level check.

Figure 9A:
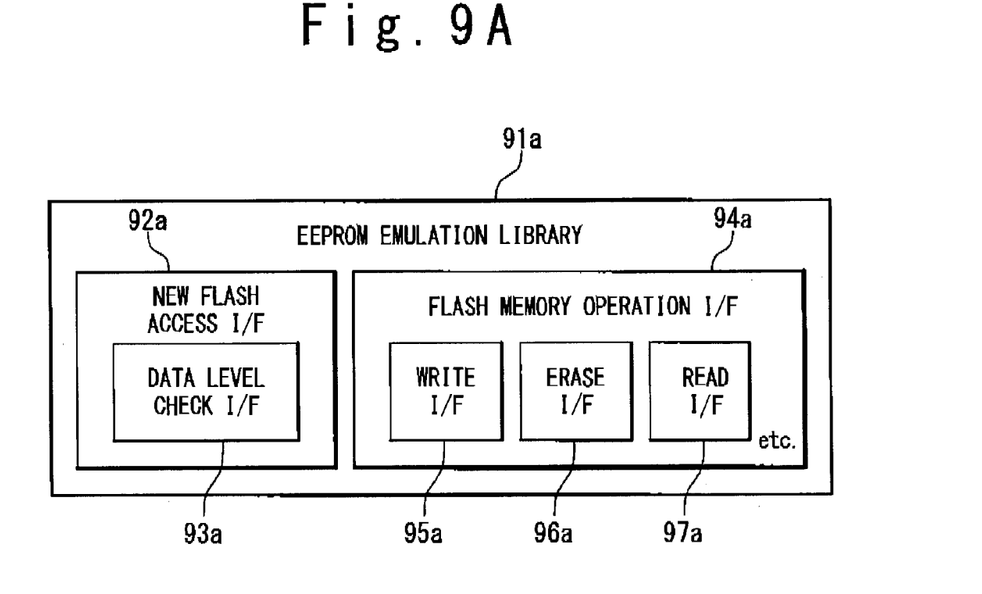
FIG. 9A is a block diagram to explain in more detail a configuration of the EEPROM emulation library according to the first embodiment of the present invention.
Figure 9B:
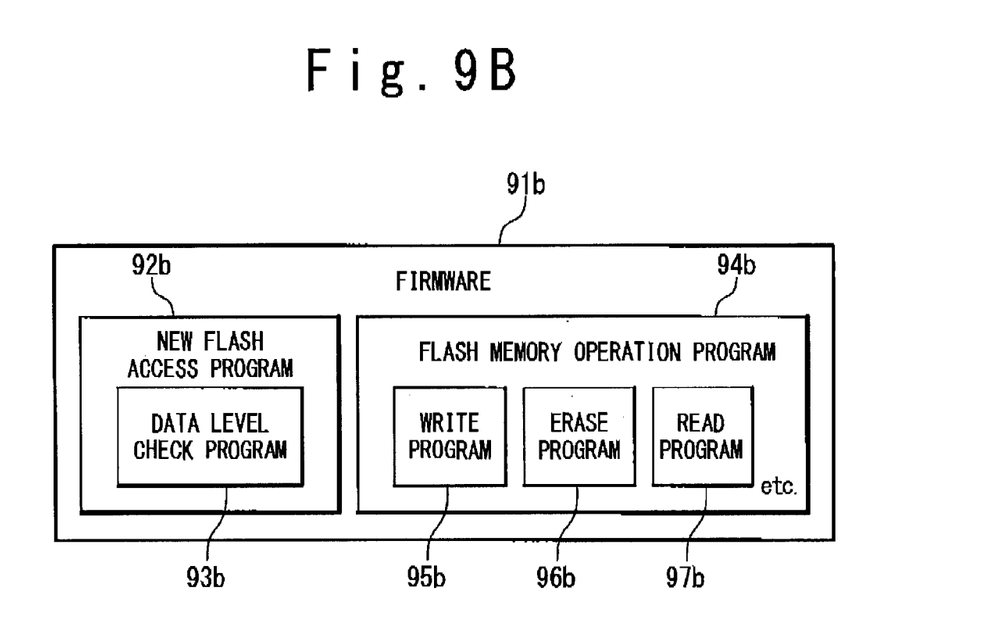
FIG. 9B is a block diagram to explain in more detail a configuration of the firmware according to the first embodiment of the present invention.

FIG. 9A and FIG. 9B are block diagrams to explain in more detail the configuration in respective storage parts of various kinds of software in the semiconductor device according to the present embodiment. The semiconductor device according to the present embodiment is provided with an EEPROM emulation library 91*a* and a firmware part 91*b*. Note that the EEPROM emulation library 91*a* and the firmware part 91*b* correspond to the EEPROM emulation library 76 and the firmware part 72 in FIG. 7 respectively.

The EEPROM emulation library 91*a* includes a new flash access I/F 92*a* and a flash memory operation I/F 94*a*. The new flash access I/F 92*a* includes a data level check I/F 93*a*. The data level check I/F 93*a* corresponds to the data level check I/F 77 in FIG. 7.

The flash memory operation I/F 94*a* includes a write I/F 95*a*, an erase I/F 96*a* and a read I/F 97*a*.

The firmware 91*b* includes a new flash access program 92*b* and a flash memory operation program 94*b*. The new flash access program 92*b* includes a data level check program 93*b*. The data level check program 93*b* corresponds to the data level check program 73 in FIG. 7.

The flash memory operation program 94*b* includes a write program 95*b*, an erase program 96*b* and a read program 97*b*.

The write I/F 95*a*, the erase I/F 96*a* and the read I/F 97*a* in the EEPROM emulation library 91*a* are the same as those used in conventional techniques. That is, the write I/F 95*a*, the erase I/F 96*a* and the read I/F 97*a* are modules to access the write program 95*b*, the erase program 96*b* and the read program 97*b* in the firmware part 91*b*.

According to the present embodiment, the new flash access I/F 92*a* and the new flash access program 92*b* are added to the EEPROM emulation library and the firmware part according to conventional techniques respectively. Here, the data level check I/F 93*a* in the new flash access I/F 92*a* is a module to access the data level check program 93*b* in the new flash access program 92*b*.

Figure 10:
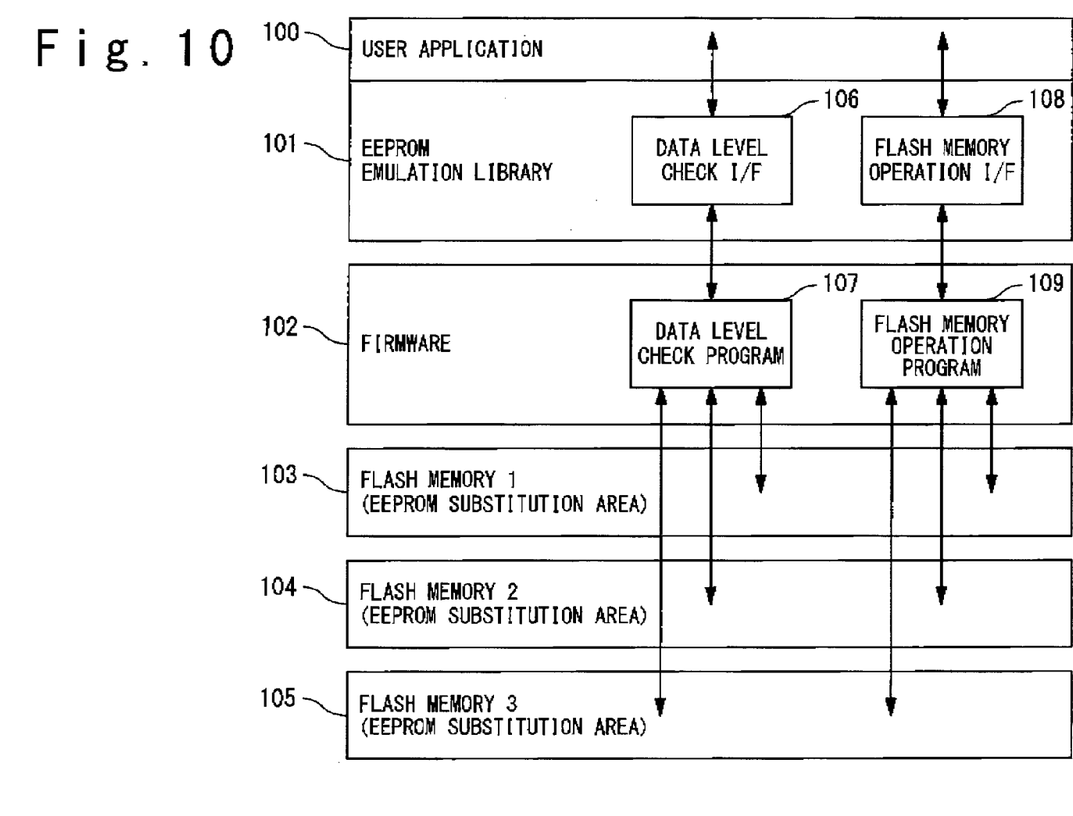
FIG. 10 is a block diagram to explain an operation in the semiconductor device according to the first embodiment of the present invention or a relationship among respective component elements in an EEPROM emulation method.

FIG. 10 is a block diagram to explain operation in the semiconductor device or a relationship among the respective component elements in the EEPROM emulation method according to the present embodiment. The semiconductor device according to the present embodiment is provided with a user application 100, an EEPROM emulation library 101, firmware 102, and first to third EEPROM substitution areas 103 to 105. The EEPROM emulation library 101 here corresponds to the EEPROM emulation library 76 in FIG. 7 and the EEPROM emulation library 91*a* in FIG. 9A. The firmware 102 also corresponds to the firmware 72 in FIG. 7 and the firmware 91*b* in FIG. 9B. Furthermore, though the number of EEPROM areas 103 to 105 is three in drawings, these are merely one example and any other total numbers may also be employed.

The EEPROM emulation library 101 includes a data level check I/F 106 and a flash memory operation I/F 108. The data level check I/F 106 here corresponds to the data level check I/F 77 in FIG. 7 and the data level check I/F 93*a* in FIG. 9A. The flash memory operation I/F 108 also corresponds to the flash memory operation I/F 94*a* in FIG. 9A.

The firmware 102 also includes a data level check program 107 and a flash memory operation program 109. The data level check program 107 here corresponds to the data level check program 73 in FIG. 7 and the data level check program 93b in FIG. 9B. The flash memory operation program 109 also corresponds to the flash memory operation program 94b in FIG. 9B.

The data level check I/F 106 is connected to the user application 100 and the data level check program 107. The data level check program 107 is further connected to the first to third EEPROM substitution areas 103 to 105.

The flash memory operation I/F 108 is connected to the user application 100 and the flash memory operation program 109. The flash memory operation program 109 is further connected to the first to third EEPROM substitution areas 103 to 105.

Next, a method to operate the flash memory in the semiconductor device according to the present embodiment will be explained. The method to operate the flash memory is similar to that of conventional techniques.

Initially, at arbitrary timing, the user application part 100 accesses the flash memory operation I/F part 108 in the EEPROM emulation library part 101.

Next, the flash memory operation I/F part 108 accesses the flash memory operation program 109 in the firmware 102.

Next, the flash memory operation program 109 executes operations such as writing, erasing and reading data with respect to a currently used EEPROM substitution area which is out of the first to third EEPROM substitution areas 103 to 105.

Next, the result obtained after executing data writing, erasing and reading is sent from the flash memory operation program 109 to the flash memory operation I/F 108.

Lastly, the result obtained after executing data writing, erasing and reading is sent from the flash memory operation I/F 108 to the user application 100.

Explained here will be a method to check a data level in the semiconductor device according to the present embodiment.

Initially, at arbitrary timing, the user application part 100 accesses the data level check I/F part 108 in the EEPROM emulation library 101. The timing may be any timing during system activation of the semiconductor device according to the present embodiment, irrespective of timing to operate the flash memory.

Next, the data level check I/F part 106 accesses the data level check program 107 in the firmware part 102.

Next, the data level check program 107 executes a level check of write data with respect to a currently used EEPROM substitution area which is one of the first to third EEPROM substitution areas 103 to 105.

Next, the result obtained by executing the level check of write data is sent from the data level check program 107 to the data level check I/F 106 in the EEPROM emulation library.

Next, the result obtained by executing the level check of write data is sent from the data level check I/F 106 to the user application 100.

Lastly, the user application 100 determines whether or not it is necessary to perform a block change by refreshing a data holding period based on the result obtained by executing the level check of write data. If it is determined to be necessary, a block change is further executed.

Figure 11A:
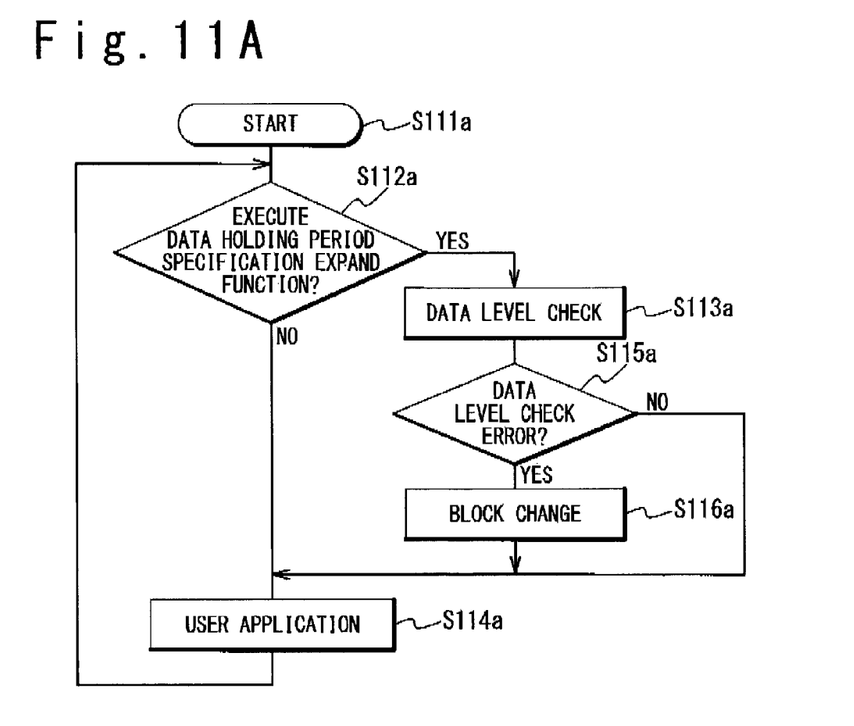
FIG. 11A is a flowchart to explain a data level check and a block change in the EEPROM emulation method according to the first embodiment of the present invention in a user system based on a user application.
Figure 11B:
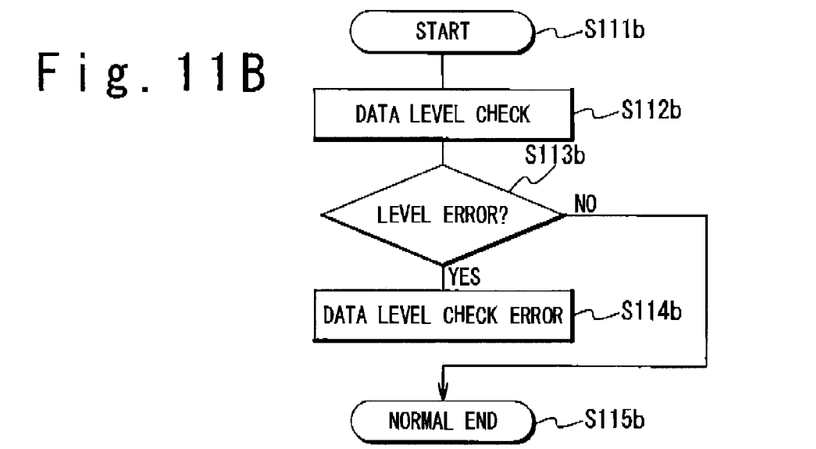
FIG. 11B is a flowchart to explain a function to expand specifications of a data holding period, which is accompanied by a block change.

FIG. 11A and FIG. 11B are flowcharts to explain a data level check and a block change in the EEPROM emulation method according to the present embodiment. FIG. 11A is a flowchart to explain a user system based on a user application. FIG. 11B is a flowchart to explain a function to expand specifications of a data holding period, which is accompanied by a block change.

The flowchart of the user system includes a total of 6 steps S111a to S116a. The flowchart provided for the function to expand specifications of a data holding period includes a total of 5 steps S111b to S115b.

In the step S111a, the user system is activated. The step S111a is followed by execution of the step S112a.

In the step S112a, the function to expand specifications of a data holding period is read at arbitrary timing in the user application and whether or not the function is executed is determined. If the determination result shows the function to expand specifications of a data holding period is executed, it is followed by execution of the step S113a. The step S113a in the user system corresponds to the steps S111b to S112b in the function to expand specifications of a data holding period. If the function to expand specifications of a data holding period is not executed, it is followed by execution of the step 3114a. The step S114a in the user system here corresponds to the step S115b in the function to expand specifications of a data holding period.

In the step S113a, a data level check is executed. What is executed next is the step 3115a. The step S115a in the user system here corresponds to the step S113b in the function to expand specifications of a data holding period.

In the step S115a, the result of a data level check is determined. If there is no problem in a checked data level, the step S114a is executed next. If a problem arises with a checked data level, the step S116a is executed next. The step S116a in the user system corresponds to the step S114b in the function to expand specifications of a data holding period. However, if a checked data level falls under the read-out voltage 86 by any chance, there is a possibility that the data may be already lost and it is therefore desirable to initialize data. For example, default data may also be stored in a memory region not shown.

In the step S116a, a block change is executed. Following next is execution of the step S114a.

In the step S114a, a control is returned to the user application. Following next is to return to the step S112a.

Figure 12A:
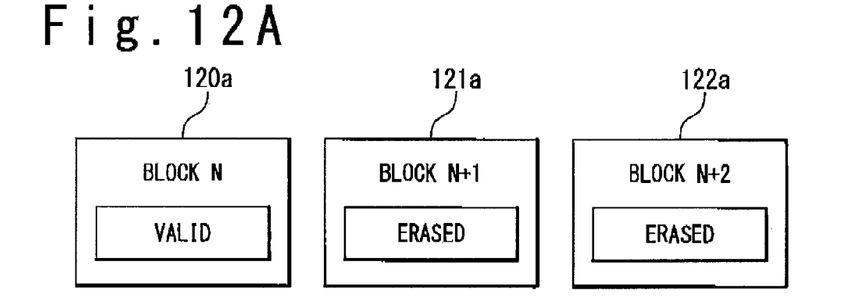
FIG. 12A shows a state observed after passing through X years from initially writing data in a first EEPROM substitution area 120*a*.
Figure 12B:
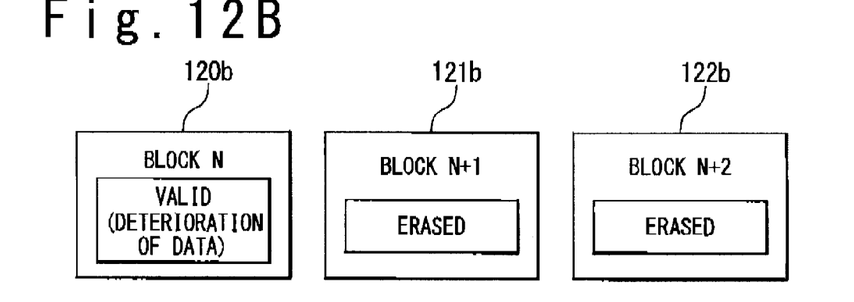
FIG. 12B shows a state in which deterioration of a data level becomes clear by executing a data level check in a first EEPROM substitution area 120*b*.
Figure 12C:
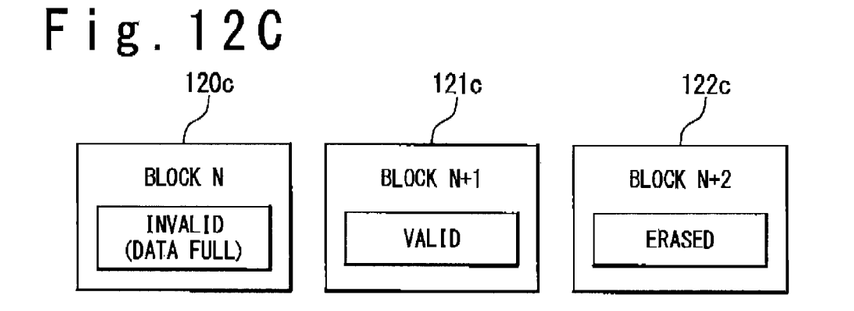
FIG. 12C shows a state observed after data is subjected to a block change from a first EEPROM substitution area 120*c* to a second EEPROM substitution area 121*c*.
Figure 12D:
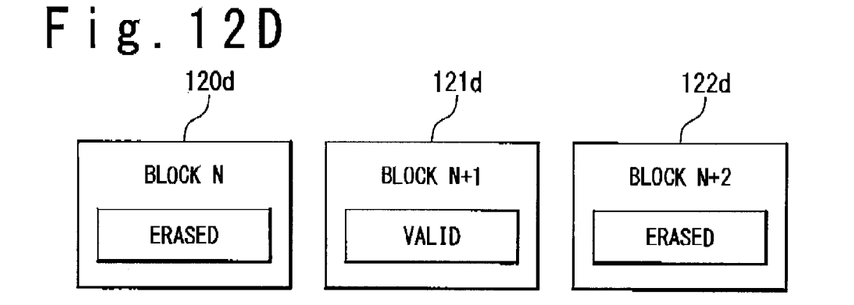
FIG. 12D shows a state in which a holding period is reset after a block change from the first EEPROM substitution area 120*c* to the second EEPROM substitution area 121*d*.

FIG. 12A to FIG. 12D are block diagrams to explain a change of a state in a plurality of EEPROM substitution areas provided in the semiconductor device according to the present embodiment. FIG. 12A shows a state observed after passing through X years from initially writing data in a first EEPROM substitution area 120a. FIG. 12B shows a state observed when a data level check is executed for a first EEPROM substitution area 120b and deterioration of a data level becomes clear. FIG. 12C shows a state observed after data is subjected to a block change from a first EEPROM substitution area 120c to a second EEPROM substitution area 121c. FIG. 12D shows a state in which a holding period is reset after a block change from a first EEPROM substitution area 120c to a second EEPROM substitution area 121d.

As explained above, the data level check I/F is added in the semiconductor device according to the present embodiment. The function to expand specifications of a data holding period is also added in the EEPROM emulation method according to the present embodiment. As a result, it is made possible for a user to confirm a deterioration state of data at any timing after writing data in each block of a flash memory used as an EEPROM substitution area. It is also made possible to refresh a starting point of a data holding period even in a system with low data updating frequency by appropriately executing a block change in a flash memory used as an EEPROM substitution area based on a confirmed deterioration state of data.

(Second Embodiment)

Figure 13A:
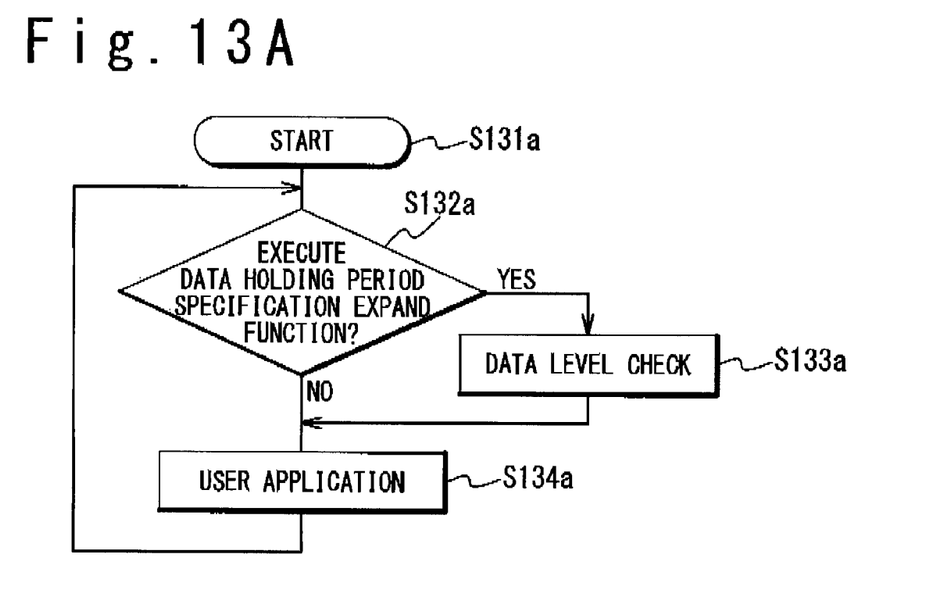
FIG. 13A is a flowchart to explain operations in a semiconductor device, namely, a data level check and a block change in the EEPROM emulation method based on a user application.
Figure 13B:
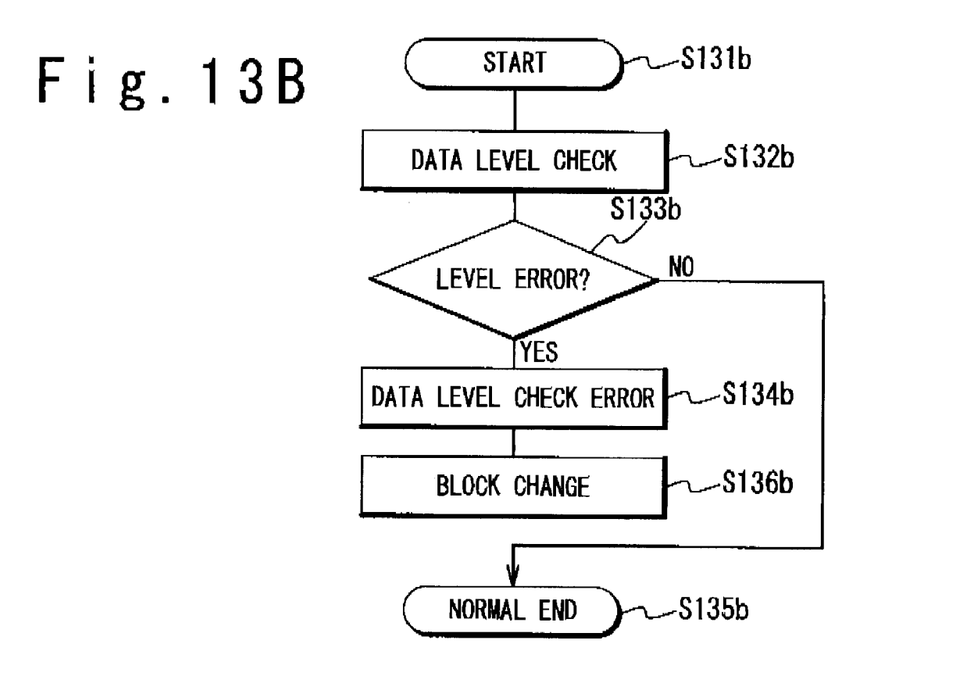
FIG. 13B is a flowchart to explain a function to expand specifications of a data holding period, which is accompanied by a block change.

FIG. 13 is a flowchart to explain operations in a semiconductor device or a data level check and a block change in an EEPROM emulation method according to a second embodiment of the present invention. FIG. 13A is a flowchart to explain a user system based on a user application. FIG. 13B is a flowchart to explain a function to expand specifications of a data holding period, which is accompanied by a block change.

The user system in the EEPROM emulation method according to the present embodiment includes a total of 4 steps S131a to S134a.

The function to expand specifications of a data holding period in the EEPROM emulation method according to the present embodiment includes a total of 6 steps S131b to S136b.

The present embodiment differs from the first embodiment according to the present invention in the following one aspect. That is, a block change which is executed when an error occurs in a data level check is realized under a control of the user system according to the first embodiment of the present invention, whereas it is realized under a control of the function to expand specifications of a data holding period according to the present embodiment.

The steps S131a, S132a, S134a, and S131b to S135b according to the present embodiment as shown in FIG. 13A and FIG. 13B correspond to the steps S111a, S112a, S114a, and S111b to S115b according to the first embodiment as shown in FIG. 11A and FIG. 11B respectively. The step S133a according to the present embodiment also equals to a step provided by combining the steps S113a to S116a according to the first embodiment.

If an error is recognized in a data level in the step S133b according to the present embodiment as shown in FIG. 13B, a necessary block change is made in the step S136b under a control of the function to expand specifications of a data holding period.

Other component elements in the present embodiment are the same as those in the first embodiment of the present invention, so that further detailed explanation thereof will be omitted.

In the present embodiment, a flash microcomputer side has a function to execute a block change based on the result of a data level check. Therefore, a load applied to a user application side is reduced. Moreover, owing to a block change which is securely executed by automatic execution, exceeding a holding period due to a change error can be prevented.

Although the inventions has been described above in connection with several preferred embodiments thereof, it will be apparent to those skilled in the art that those embodiments are provided solely for illustrating the invention, and should not be relied upon to construe the appended claims in a limiting sense.

What is claimed is:

1. A semiconductor device comprising:
a flash memory having an EEPROM substitution area for performing an EEPROM emulation;
a CPU; and
a data level check circuit configured to perform a comparison between a voltage level corresponding to a data written in any of blocks of the EEPROM substitution area and a predetermined data level check voltage;
wherein the CPU is configured to perform a block change by which the data is read out from said any of blocks and written in another block when the voltage level corresponding to the data becomes lower than the data level check voltage.

2. The semiconductor device according to claim 1, further comprising:
a firmware which comprises a flash memory operation program performed by the CPU to perform writing and reading of the flash memory by block unit, and a data level check program performed by the CPU to control the data level check circuit,
wherein the flash memory further has:
a program area storing a predetermined user application being performed by the CPU; and
an EEPROM emulation library configured to perform an EEPROM emulation by calling the firmware by the CPU, and
the user application is configured to be performed by calling the flash memory operation program, and
the user application is configured to be performed by calling the block change at any timing independent from the flash memory operation program.

3. The semiconductor device according to claim 2, wherein the flash memory operation program further comprises:
an erase program configured to erase said any of blocks after the data is read out from said any of blocks in the block change.

4. The semiconductor device according to claim 2, wherein in the data level check program, the comparison is performed for all bits corresponding to data written in said any of blocks in the data level check program.

5. The semiconductor device according to claim 1, wherein the flash memory further comprises:
a default data for overwriting the data when the voltage level corresponding to the data is out of a threshold voltage range in which the flash memory is set to be readable.

6. An emulation method of an EEPROM comprising:
performing a comparison between a voltage level corresponding to a data written in any of blocks of an EEPROM substitution area and a predetermined data level check voltage; and
performing a block change by which the data is read out from said any of blocks and written in other block when the voltage level corresponding to the data becomes lower than the data level check voltage.

7. The emulation method of the EEPROM according to claim 6, further comprising:
performing a predetermined user application,
wherein the performing the predetermined user application comprises:
writing a data in any of blocks in the EEPROM substitution area;
reading the data written in said any of blocks from the EEPROM substitution area; and
performing the comparison at any timing independent from the writing and the reading.

8. The emulation method of the EEPROM according to claim 6, wherein the performing the block change comprises:
erasing said any of blocks after the data is read out from said any of blocks.

9. The emulation method of the EEPROM according to claim 6, wherein the performing the comparison comprises:
performing the comparison for all bits corresponding to data written in said any of blocks.

10. The emulation method of the EEPROM according to claim 6, wherein the performing the block change comprises:
overwriting the data to a default data when the voltage level corresponding to the data is out of a threshold voltage range in which the flash memory is set to be readable.

* * * * *